United States Patent
Lim et al.

(10) Patent No.: US 10,685,926 B2
(45) Date of Patent: Jun. 16, 2020

(54) ANTENNA MODULE

(71) Applicant: SAMSUNG ELECTRO-MECHANICS CO., LTD., Suwon-si, Gyeonggi-do (KR)

(72) Inventors: Jae Hyun Lim, Suwon-si (KR); Han Kim, Suwon-si (KR); Chul Kyu Kim, Suwon-si (KR); Sang Jong Lee, Suwon-si (KR); Jung Ho Shim, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/284,289

(22) Filed: Feb. 25, 2019

(65) Prior Publication Data
US 2020/0020653 A1    Jan. 16, 2020

(30) Foreign Application Priority Data
Jul. 12, 2018   (KR) .................. 10-2018-0081186

(51) Int. Cl.
| H01L 23/66 | (2006.01) |
| H01Q 1/24 | (2006.01) |
| H01L 23/00 | (2006.01) |

(52) U.S. Cl.
CPC .............. *H01L 23/66* (2013.01); *H01L 24/09* (2013.01); *H01Q 1/243* (2013.01); *H01L 2223/6677* (2013.01); *H01L 2224/02379* (2013.01)

(58) Field of Classification Search
CPC .  H01L 23/66; H01L 24/09; H01L 2223/6677; H01L 2224/02379; H01Q 1/243
(Continued)

(56) References Cited

U.S. PATENT DOCUMENTS
| 9,978,731 B1 | 5/2018 | Kim |
| 2007/0087512 A1 | 4/2007 | Cho et al. |
(Continued)

FOREIGN PATENT DOCUMENTS
| CN | 108257926 A | 7/2018 |
| JP | 2004-140134 A | 5/2004 |
(Continued)

OTHER PUBLICATIONS

Office Action issued in Korean Application No. 10-2018-0081186 dated May 24, 2019, with English translation.
(Continued)

*Primary Examiner* — Dao H Nguyen
(74) *Attorney, Agent, or Firm* — Morgan, Lewis & Bockius LLP

(57) ABSTRACT

An antenna module includes an antenna substrate including a core layer, insulating layers disposed on opposite surfaces of the core layer, and wiring layers including antenna patterns. The antenna substrate has first and second recess portions. The antenna module further includes a passive component disposed in the first recess portion, a semiconductor chip disposed in the second recess portion and having an active surface, an encapsulant encapsulating at least portions of the semiconductor chip and the passive component, and a connection portion disposed on the active surface of the semiconductor chip and including redistribution layers electrically connected to the semiconductor chip. The passive component has a thickness greater than that of the semiconductor chip, and the first recess portion has a depth greater than that of the second recess portion.

20 Claims, 11 Drawing Sheets

(58) Field of Classification Search
USPC ............... 257/664, 690, 774, 776, E21.476, 257/E21.502; 327/564; 361/679.31, 761, 361/767, 770; 438/675, 107, 127
See application file for complete search history.

(56) References Cited

U.S. PATENT DOCUMENTS

| | | |
|---|---|---|
| 2008/0076249 A1 | 3/2008 | Fujii et al. |
| 2012/0182066 A1 | 7/2012 | Merkle et al. |
| 2013/0119553 A1 | 5/2013 | Jeong et al. |
| 2014/0084415 A1 | 3/2014 | Lin et al. |
| 2014/0293529 A1* | 10/2014 | Nair ...................... H01Q 1/2291 361/679.31 |
| 2016/0118313 A1* | 4/2016 | Gong .................. H01L 23/3114 257/773 |
| 2016/0268214 A1* | 9/2016 | Yu ........................... H01L 23/16 |
| 2016/0351729 A1* | 12/2016 | Ishibashi ................. H01L 23/66 |
| 2017/0287853 A1 | 10/2017 | Kim et al. |
| 2018/0182691 A1 | 6/2018 | Cho et al. |
| 2018/0323159 A1* | 11/2018 | Kamgaing ............. H01L 24/16 |
| 2018/0331051 A1* | 11/2018 | Dogiamis ............... H01L 23/58 |
| 2018/0350772 A1* | 12/2018 | Nair ........................ H01L 23/66 |
| 2020/0006307 A1* | 1/2020 | Tsai .................... H01L 23/3114 |

FOREIGN PATENT DOCUMENTS

| | | |
|---|---|---|
| JP | 2008-78207 A | 4/2008 |
| KR | 10-0700922 B1 | 3/2007 |
| KR | 10-2012-0083862 A | 7/2012 |
| KR | 10-2013-0051708 A | 5/2013 |
| KR | 10-2018-0073371 A | 7/2018 |
| TW | 201729387 A | 8/2017 |
| TW | 201743415 A | 12/2017 |
| WO | 2017/111766 A1 | 6/2017 |
| WO | 2017/209761 A1 | 12/2017 |

OTHER PUBLICATIONS

Office Action issued in corresponding Taiwanese Patent Application No. 108105737 dated Dec. 20, 2019, with English translation.
Notice of Allowance and Search Report issued in corresponding Taiwanese Patent Application No. 108105737 dated Mar. 31, 2020, with English translation.

* cited by examiner

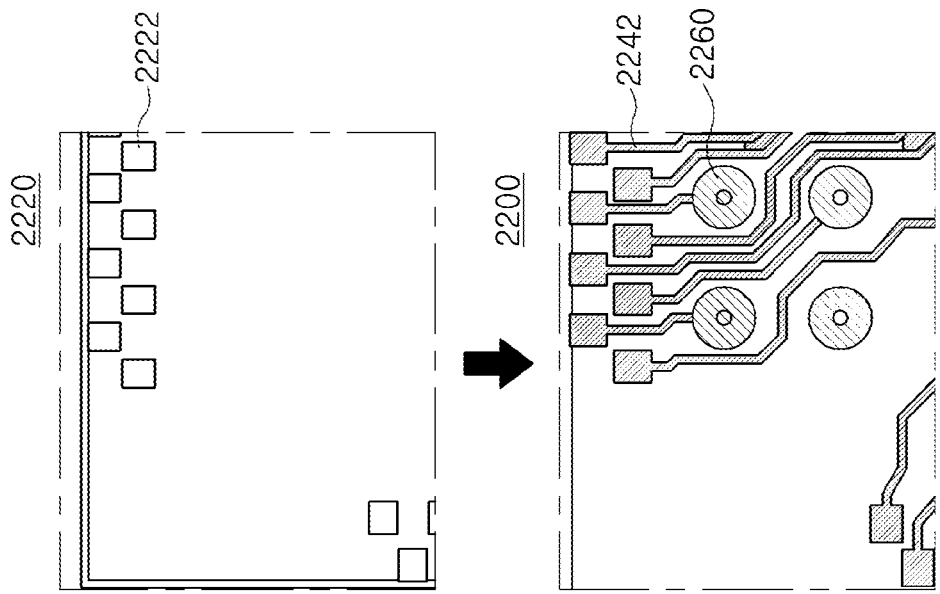
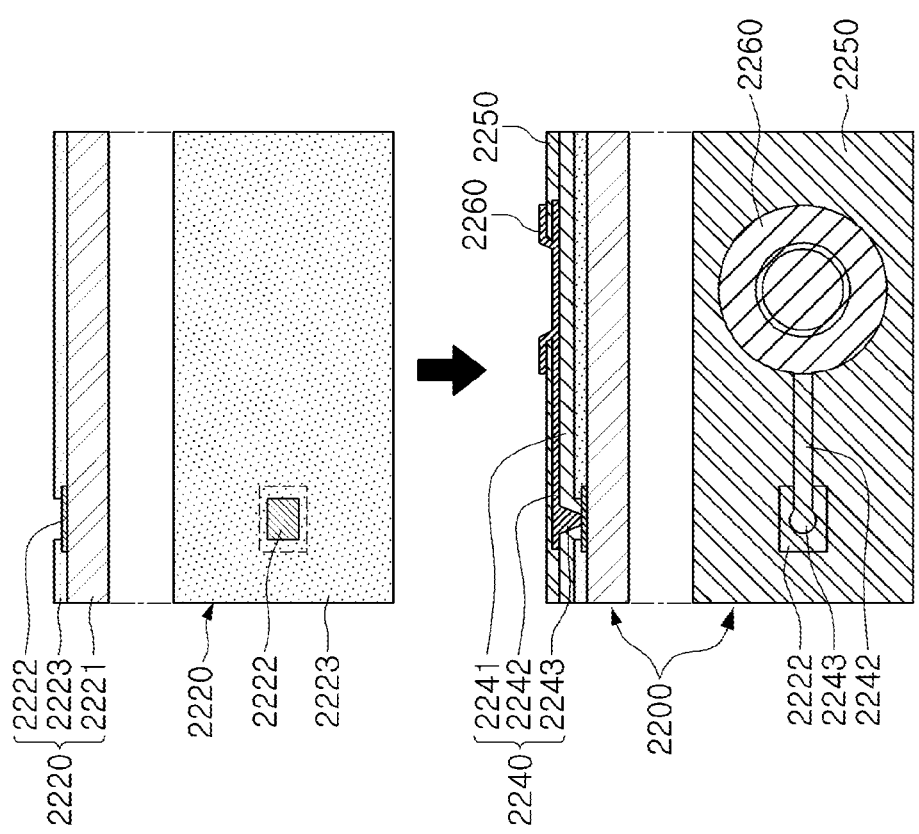

ANTENNA MODULE

CROSS-REFERENCE TO RELATED APPLICATION(S)

This application claims benefit of priority to Korean Patent Application No. 10-2018-0081186 filed on Jul. 12, 2018 in the Korean Intellectual Property Office, the disclosure of which is incorporated herein by reference in its entirety.

BACKGROUND

1. Field

The present disclosure relates to an antenna module including an antenna substrate and a semiconductor chip.

2. Description of Related Art

Recently, in accordance with the trend for thinness of electronic devices, various components mounted in a mobile device such as a smartphone are required to be miniaturized. Therefore, when a millimeter wave/5G antenna module is used in such a mobile device, many limitations occur in terms of a size, a thickness, and the like, of the millimeter wave/5G antenna module in order to secure a degree of freedom in a mounting position of the millimeter wave/5G antenna module within a mobile device and significantly reduce the number of processes.

SUMMARY

An aspect of the present disclosure provides an antenna module having a degree of freedom at the time of being mounted in a set through having a significantly reduced thickness in spite of including a semiconductor chip and a passive component and omitting a connector.

According to an aspect of the present disclosure, an antenna module includes an antenna substrate having a recess portion disposed therein, and a semiconductor chip and a passive component mounted in the recess portion.

According to an aspect of the present disclosure, an antenna module includes an antenna substrate including a core layer, a plurality of insulating layers disposed on opposite surfaces of the core layer, and a plurality of wiring layers including antenna patterns. First and second recess portions are recessed from a lower surface of the antenna substrate. The antenna module further includes a passive component disposed in the first recess portion, a semiconductor chip disposed in the second recess portion and having an active surface having connection pads disposed thereon and an inactive surface opposing the active surface, an encapsulant encapsulating at least portions of the semiconductor chip and the passive component, and a connection portion disposed on the active surface of the semiconductor chip and including redistribution layers electrically connected to the connection pads of the semiconductor chip. The passive component has a thickness greater than that of the semiconductor chip, and the first recess portion has a depth greater than that of the second recess portion.

BRIEF DESCRIPTION OF DRAWINGS

The above and other aspects, features, and advantages of the present disclosure will be more clearly understood from the following detailed description taken in conjunction with the accompanying drawings, in which:

FIGS. 3A and 3B are schematic cross-sectional views illustrating a fan-in semiconductor package before and after being packaged;

DETAILED DESCRIPTION

Figure 1:
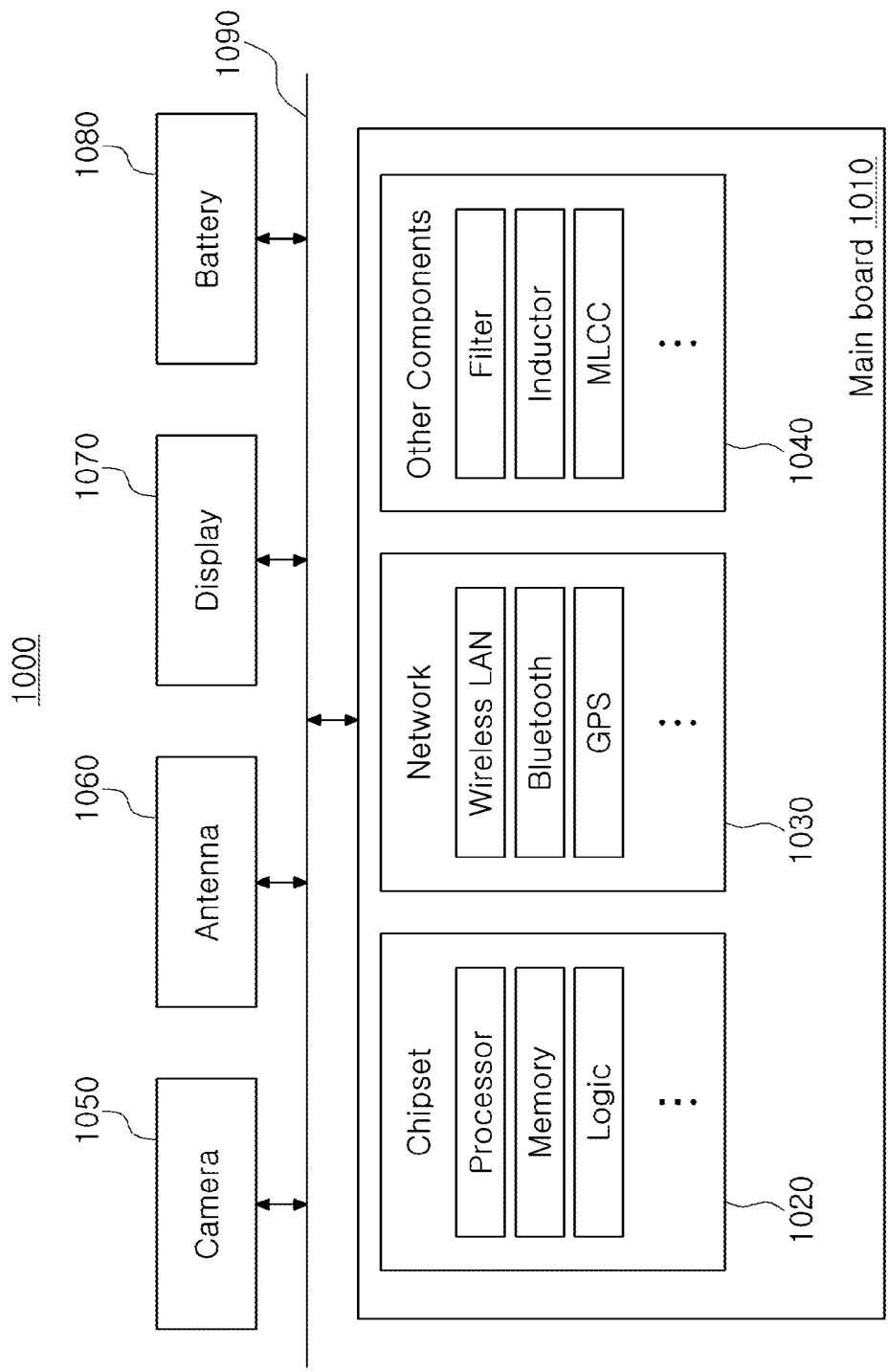
FIG. 1 is a schematic block diagram illustrating an example of an electronic device system.

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a direction toward a mounting surface of the fan-out semiconductor package in relation to cross sections shown in the drawings, while an upper side, an upper portion, an upper surface, and the like, are used to refer to an opposite direction to the lower side/portion/surface/direction. However, these directions are defined for convenience of explanation, and the claims are not particularly limited by the directions defined as described above.

The meaning of a "connection" of a component to another component in the description conceptually includes an indirect connection through an adhesive layer as well as a direct connection (e.g., with direct contact) between two components. In addition, "electrically connected" conceptually includes a physical connection and a physical disconnection. It can be understood that when an element is referred to with terms such as "first" and "second", the element is not limited thereby. The terms may be used only for a purpose of distinguishing one element from other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment throughout the disclosure, and is provided to emphasize a particular feature or characteristic different from that of another exemplary embodiment. However, exemplary embodiments provided herein are considered to be able to be implemented by being combined in whole or in part with one another. For example, one element described in a particular exemplary embodiment, even if it is not described in another exemplary embodiment, may be understood as being amenable to integration in the other exemplary embodiment, unless an opposite or contradictory description is provided therein.

Terms used herein are used only in order to describe an exemplary embodiment rather than limit the present disclosure. In this case, singular forms include plural forms unless interpreted otherwise in context.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
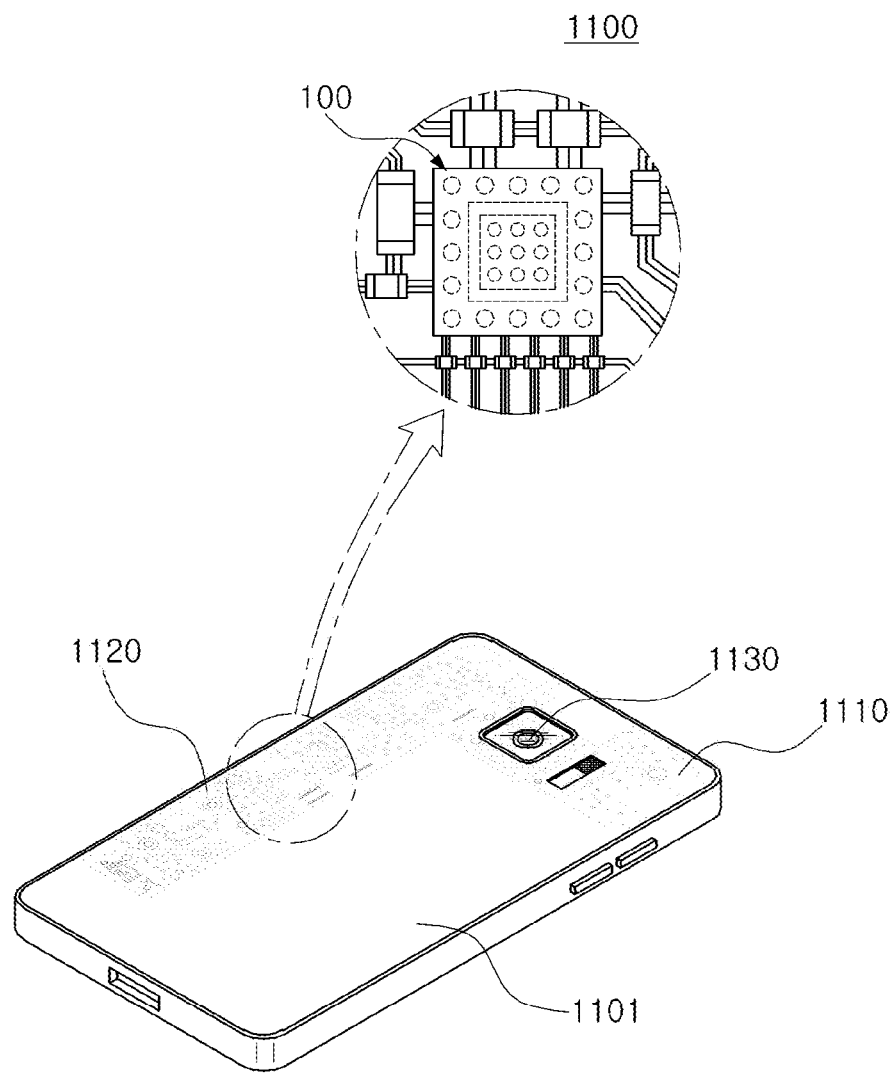
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in itself, and may be damaged due to external physical or chemical impact. Therefore, the semiconductor chip is generally not used in itself, and instead is packaged and is used in an electronic device, or the like, in a packaged state.

The reason why semiconductor packaging is used is that there commonly is a difference in a circuit width between the semiconductor chip and a mainboard of the electronic device in terms of electrical connection. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology is therefore used for buffering a difference in a circuit width between the semiconductor and the mainboard.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

FIGS. 3A and 3B are schematic cross-sectional views illustrating states of a fan-in semiconductor package before and after being packaged.

Figure 4:
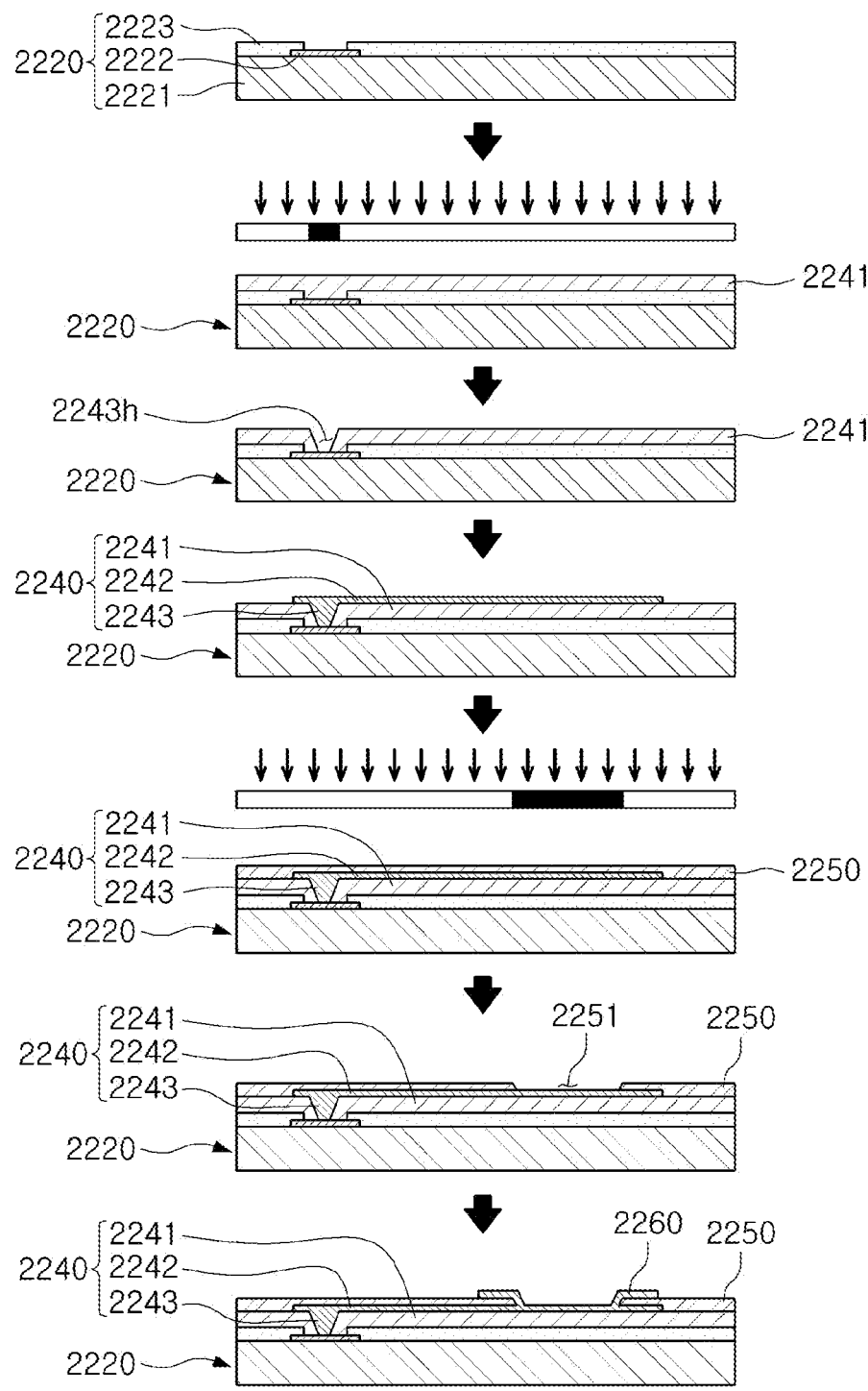
FIG. 4 is schematic cross-sectional views illustrating a packaging process of a fan-in semiconductor package.

FIG. 4 is schematic showing cross-sectional views illustrating a packaging process of a fan-in semiconductor package.

Referring to FIGS. 3A, 3B, and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimageable dielectric (PID), forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a small size.

In addition, due to the disadvantage described above, the fan-in semiconductor package may not be directly mounted and used on the mainboard of the electronic device. The reason is that even in the case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
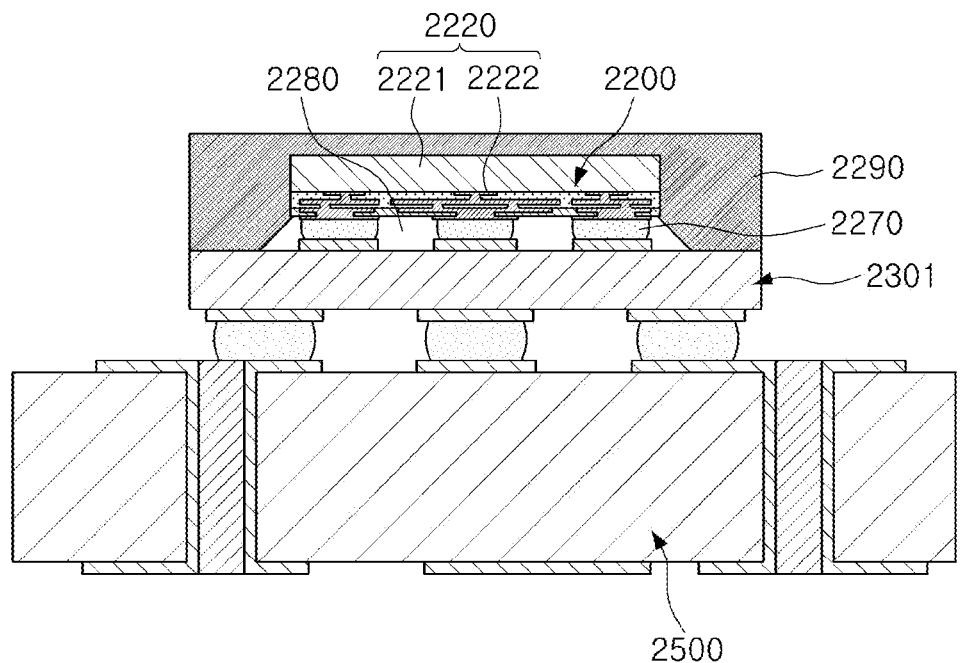
FIG. 5 is a schematic cross-sectional view illustrating a fan-in semiconductor package mounted on an interposer substrate and ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device.

Figure 6:
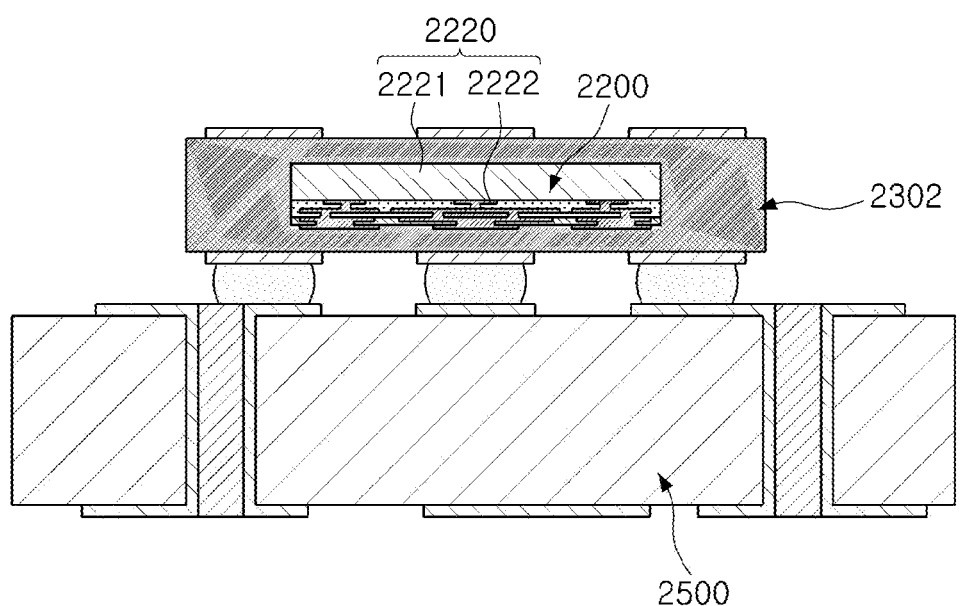
FIG. 6 is a schematic cross-sectional view illustrating a fan-in semiconductor package embedded in an interposer substrate and ultimately mounted on a mainboard of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of a semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
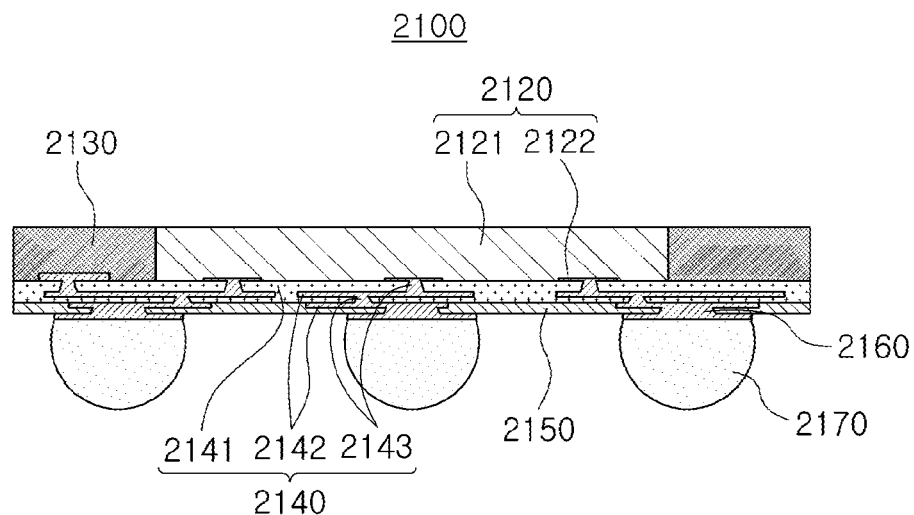
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in the case in which a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
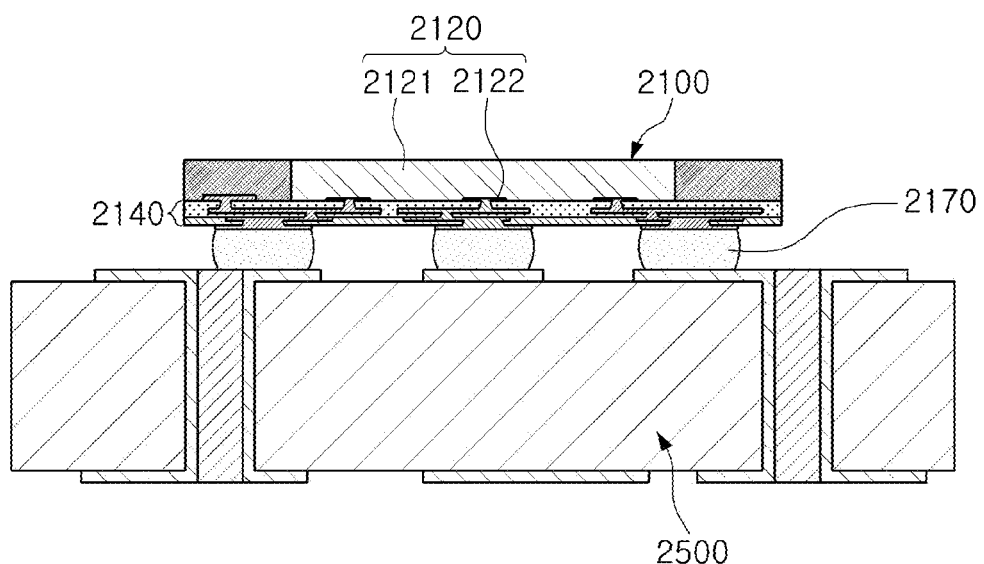
FIG. 8 is a schematic cross-sectional view illustrating a fan-out semiconductor package mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Antenna Module

Figure 9:
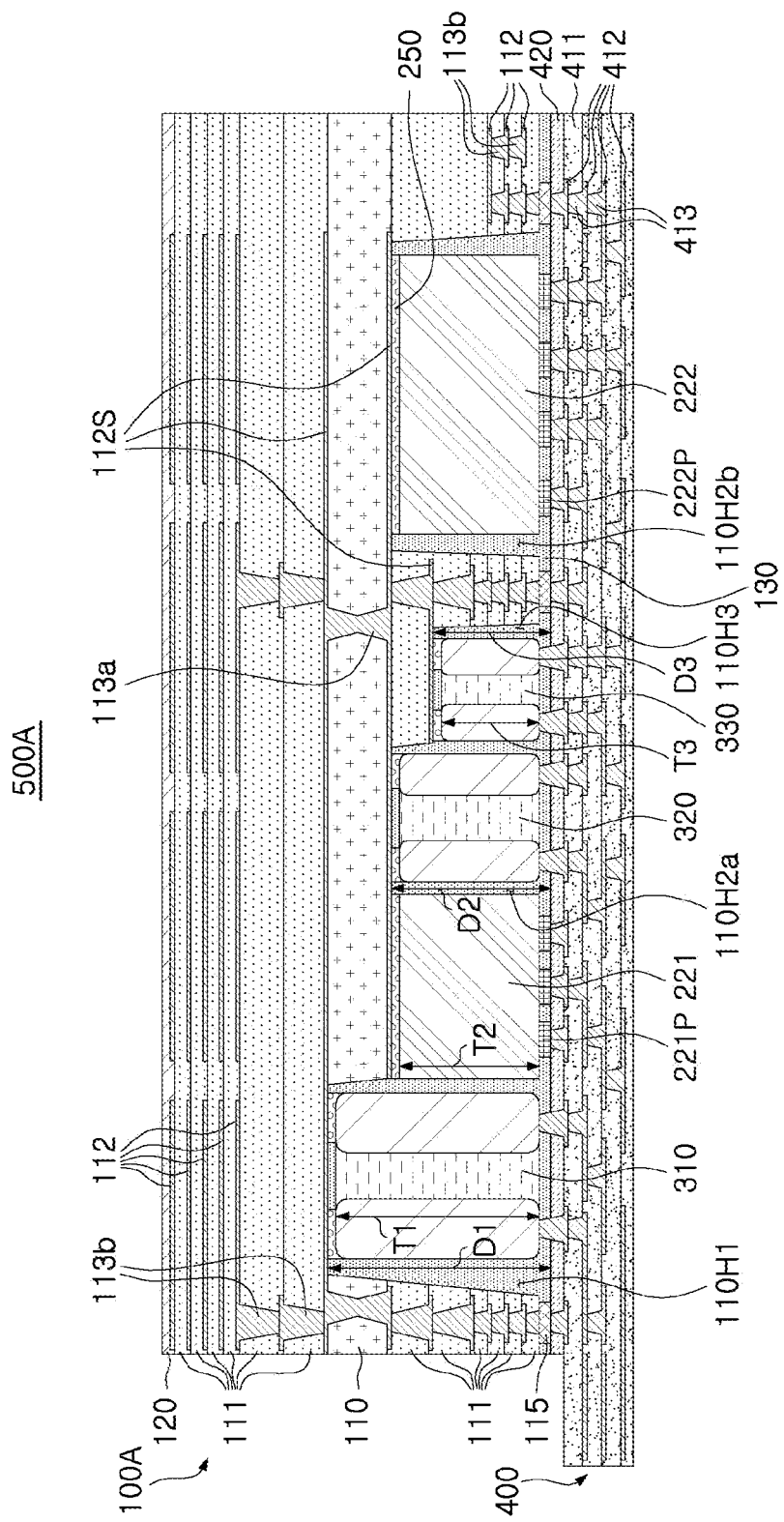
FIG. 9 is a schematic cross-sectional view illustrating an antenna module according to an exemplary embodiment.

FIG. 9 is a schematic cross-sectional view illustrating an antenna module according to an exemplary embodiment in the present disclosure.

Referring to FIG. 9, an antenna module 500A according to an exemplary embodiment may include an antenna substrate 100A, passive components 310, 320, and 330 disposed in recess portions 110H1, 110H2a, 110H2b, and 110H3 of the antenna substrate 100A, semiconductor chips 221 and 222 disposed in second recess portions 110H2a and 110H2b of the antenna substrate 100A, respectively, an encapsulant 130 encapsulating at least portions of the passive components 310, 320, and 330 and the semiconductor chips 221 and 222, and a connection portion 400 disposed on an active surface of each of the semiconductor chips 221 and 222 beneath the antenna substrate 100A and including wiring layers 412 electrically connected to connection pads 221P and 222P of the semiconductor chips 221 and 222.

Recently, in accordance with the trend toward increasing thinness of electronic devices, the thicknesses of various components mounted in a mobile device such as a smartphone are significantly limited. Therefore, when a millimeter wave/5G antenna module is used in the mobile device, there can be many limitations in a size, a thickness, and the like, of the millimeter wave/5G antenna module antenna module in order to secure a degree of freedom of the millimeter wave/5G antenna module in a mounting position within a set.

Meanwhile, when an antenna module is implemented in a general system-in-package (SIP) type module manner, various semiconductor chips and passive components are mounted on a bottom surface of an antenna substrate by surface mount technology (SMT). Further, in order to prevent electromagnetic interference (EMI), a shield can covering the semiconductor chips and the passive components is attached to the semiconductor chips and the passive components. Alternatively, the semiconductor chips and the passive components are covered with an epoxy molding compound (EMC), and a metal layer is then formed on an outer surface of the EMC. In this case, since an entire thickness of the module is determined by a passive component, particularly, a component having a great thickness, such as a power inductor (PI), there is a limitation in reducing the entire thickness of the module unless a thickness of the power inductor is reduced or a method of mounting the power inductor is changed.

On the other hand, in the antenna module 500A according to the exemplary embodiment, electronic components such as various semiconductor chips 221 and 222 and passive components 310, 320, and 330 may be mounted in the recess portions 110H1, 110H2a, 110H2b, and 110H3 in the antenna substrate 100A. Particularly, the recess portions 110H1, 110H2a, 110H2b, and 110H3 may be formed to have different depths, such that an entire thickness of the antenna module 500A may be maintained (e.g., maintained constant) regardless of thicknesses of the semiconductor chips 221 and 222 and the passive components 310, 320, and 330. A first passive component 310 having a first thickness T1 may be mounted in the first recess portion 110H1 having a first depth D1, and a second passive component 320 and first and second semiconductor chips 221 and 222 having a second thickness T2 smaller than the first thickness T1 may be mounted in second recess portions 110H2a and 110H2b having a second depth D2 smaller than the first depth D1. In addition, a third passive component 330 having a third thickness T3 smaller than the second thickness T2 may be mounted in a third recess portion 110H3 having a third depth D3 smaller than the second depth D2. Therefore, even in a case in which thicknesses of mounted electronic components such as the semiconductor chips 221 and 222 and the passive components 310, 320, and 330 are various and different from each other, the semiconductor chips 221 and 222 and the passive components 310, 320, and 330 may be mounted so that lower surfaces thereof are substantially coplanar with one another. Therefore, an entire thickness of the antenna module 500A may be reduced. In addition, the connection portion 400 electrically connected to the semiconductor chips 221 and 222 and the passive components 310, 320, and 330 may be disposed beneath the antenna substrate 100A. The semiconductor chips 221 and 222 and the passive components 310, 320, and 330 may be physically and/or electrically connected to other components in a set through the connection portion 400, such that a connector disposed in the antenna substrate 100A may be omitted.

The respective components included in the antenna module 500A according to the exemplary embodiment will hereinafter be described in more detail.

The antenna substrate 100A, which is a region or structure capable of implementing a millimeter wave/5G antenna, may include wiring layers 112 including antenna patterns and ground patterns. In detail, the antenna substrate 100A may include a core layer 110, insulating layers 111, a passivation layer 120, wiring layers 112, and connection via layers 113a and 113b. The antenna substrate 100A according to the exemplary embodiment may have a form in which the insulating layers 111 are built-up on opposite surfaces of the core layer 110. In this case, the wiring layers 112 may be disposed on the core layer 110 and the respective insulating layers 111. The wiring layers 112 may be electrically connected to each other through the connection via layers 113a and 113b penetrating through the core layer 110 and the respective insulating layers 111.

An insulating material may be used as a material of the core layer 110. In this case, the insulating material may be a thermosetting resin such as an epoxy resin, a thermoplastic resin such as a polyimide resin, a material including a reinforcing material such as a glass fiber (or a glass cloth or a glass fabric) and/or an inorganic filler together with the thermosetting resin and the thermoplastic resin, for example, prepreg. However, the material of the core layer 110 is not limited to the resin, and may be, for example, a glass plate or a ceramic plate.

The antenna patterns and/or the ground patterns of the wiring layers 112 may be disposed on upper and lower surfaces of the core layer 110. For example, the antenna patterns may be disposed on the upper surface of the core layer 110, and the ground patterns may be disposed on the lower surface of the core layer 110. In this case, a distance between an antenna and a ground plane may be stably secured within a single composite module regardless of a change in an external environment, such that radiation characteristics of the antenna may be maintained. In addition, the antenna substrate 100A may be miniaturized by appropriately adjusting a dielectric constant of the core layer 110 to significantly reduce a size of the antenna module 500A, resulting in improvement of spatial efficiency of the entire antenna module 500A.

An insulating material may be used as a material of each of the insulating layers 111. In this case, the insulating material may be a thermosetting resin such as an epoxy resin, a thermoplastic resin such as a polyimide resin, a material including a reinforcing material such as an inorganic filler together with the thermosetting resin and the thermoplastic resin, for example, an Ajinomoto Build-up Film (ABF). However, the material of each of the insulating layers is not limited thereto, but may also be a photoimageable dielectric (PID). Even though materials of the insulating layers 111 are the same as each other, a boundary between the insulating layers may be apparent.

The wiring layers 112 may include the antenna patterns substantially implementing a millimeter wave/5G antenna, or the like, and may further include ground patterns, feeding patterns, or the like. The antenna patterns may be a dipole antenna, a patch antenna, or the like, depending on a disposition and a shape of the antenna patterns. The ground patterns may have a ground plane form. The antenna patterns may be surrounded by ground patterns disposed on the same level, but are not limited thereto. The wiring layers 112 may include signal patterns, power patterns, resistor patterns, or the like. Particularly, stopper layers 112S of the wiring layers 112 exposed through the entire rear surfaces of the recess portions 110H1, 110H2a, 110H2b, and 110H3 may function as stopper layers in a process such as a sandblast process for forming the recess portions 110H1, 110H2a, 110H2b, and 110H3. A material of each of the wiring layers 112 may be a conductive material such as copper (Cu), aluminum (Al), silver (Ag), tin (Sn), gold (Au), nickel (Ni), lead (Pb), titanium (Ti), or alloys thereof, but is not limited thereto.

The connection via layers 113a and 113b may electrically connect the wiring layers 112 formed on different layers to each other, resulting in an electrical path in the antenna substrate 100A. The connection via layers 113a and 113b may include a first connection via layer 113a penetrating through the core layer 110 and second connection via layers 113b penetrating through the insulating layers 111. The connection via layers 113a and 113b may include feeding vias connected to the antenna patterns in an electrical manner and/or a signal manner, and may further include ground connection vias, or the like. The connection via layers 113a and 113b may further include signal connection vias, power connection vias, or the like. Some of the ground connection vias may surround the feeding vias. A material of each of the connection via layers 113a and 113b may be a conductive material such as copper (Cu), aluminum (Al), silver (Ag), tin (Sn), gold (Au), nickel (Ni), lead (Pb), titanium (Ti), or alloys thereof. A connection via of each of the connection via layers 113a and 113b may be completely filled with the conductive material, or the conductive material may be formed along a wall of each of via holes unlike illustrated in the drawing. In addition, each of the connection via layers may have any known vertical cross-sectional shapes such as a cylindrical shape, an hourglass shape, a tapered shape, or the like.

The recess portions 110H1, 110H2a, 110H2b, and 110H3 may be formed by recessing the antenna substrate 100A from a lower surface of the antenna substrate 100A by predetermined depths. Each of the recess portions 110H1, 110H2a, 110H2b, and 110H3 may have a blind cavity form. Each of the recess portions 110H1, 110H2a, 110H2b, and 110H3 may have inclined sidewalls, but is not limited thereto. The recess portions 110H1, 110H2a, 110H2b, and 110H3 may have the same depth or different depths. As illustrated in the drawing, the first recess portion 110H1, the second recess portions 110H2a and 110H2b, and the third recess portion 110H3 may have different depths D1, D2, and D3, respectively. The recess portions 110H1, 110H2a, 110H2b, and 110H3 may be disposed to be connected to each other or be disposed to be spaced apart from each other, and the number and a disposition form of recess portions 110H1, 110H2a, 110H2b, and 110H3 may be variously modified in other exemplary embodiments. The first recess portion 110H1 may have the depth D1 at which it extends up to the upper surface of the core layer 110, the second recess portions 110H2*a* and 110H2*b* may have the depth D2 at which they extend up to the lower surface of the core layer 110, and the third recess portion 110H3 may have the depth D3 at which it extends up to some of the insulating layers 111 below the core layer 110. However, according to other exemplary embodiments, the recess portions 110H1, 110H2*a*, 110H2*b*, and 110H3 may also extend up to some of the insulating layers 111 above the cover layer 110.

The passivation layer 120 may be disposed on an uppermost layer of the antenna substrate 100A to protect internal components of the antenna substrate 100A. The passivation layer 120 may also include an insulating material, for example, an ABF, but is not limited thereto. According to other exemplary embodiments, the passivation layer 120 may further be disposed on the lower surface of the antenna substrate 100A.

The semiconductor chips 221 and 222 may include a first semiconductor chip 221 and a second semiconductor chip 222 performing different functions. In this case, the first semiconductor chip 221 may be a power management integrated circuit (PMIC), the second semiconductor chip 222 may be a radio frequency integrated circuit (RFIC), and the first and second semiconductor chips 221 and 222 may be electrically connected to each other. The first semiconductor chip 221 may be mounted in the second recess portion 110H2*a*, and the second semiconductor chip 222 may be mounted in another second recess portion 110H2*b* disposed to be spaced apart from the second recess portion 110H2*a*. Inactive surfaces of the semiconductor chips 221 and 222 may be attached to the stopped layers 112S exposed to the rear surfaces of the second recess portions 110H2*a* and 110H2*b* through any known adhesive member 250 such as a die attach film (DAF).

The active surfaces of the semiconductor chips 221 and 222 refer to surfaces of the semiconductor chips 221 and 222 on which the connection pads 221P and 222P are disposed, and the inactive surfaces of the semiconductor chips 221 and 222 refer to surfaces of the semiconductor chips 221 and 222 opposing the active surfaces. Each of the semiconductor chips 221 and 222 may be formed on the basis of an active wafer. In this case, a base material of a body of each of the semiconductor chips may be silicon (Si), germanium (Ge), gallium arsenide (GaAs), or the like. The connection pads 221P and 222P may electrically connect the semiconductor chips 221 and 222 to other components. A material of each of the connection pads 221P and 222P may be a conductive material such as aluminum (Al), or the like. The semiconductor chips 221 and 222 may be electrically connected to the antenna substrate 100A and the passive components 310, 320, and 330 through the connection pads 221P and 222P and the connection portion 400. The number and a disposition form of semiconductor chips 221 and 222 mounted in the antenna substrate 100A may be variously modified in other exemplary embodiments.

Each of the passive components 310, 320, and 330 may be an electronic component such as a capacitor, an inductor, or the like. As a non-restrictive example, the first passive component 310 may be a power inductor (PI) required to have a great thickness in order to have a high inductance. The passive components 310, 320, and 330 may have different thicknesses, and may be mounted in different recess portions 110H1, 110H2*a*, 110H2*b*, and 110H3. The first passive component 310 may be mounted in the first recess portion 110H1, the second passive component 320 may be mounted in the second recess portion 110H2*a*, and the third passive component 330 may be mounted in the third recess portion 110H3. The passive components 310, 320, and 330 may be attached to the stopper layers 112S exposed through the rear surfaces of the recess portions 110H1, 110H2*a*, 110H2*b*, and 110H3 through any known adhesive member 250 such as a DAF. The thickness T1 of the first passive component 310 may be greater than the thickness T2 of each of the semiconductor chips 221 and 222. The thickness T2 of the second passive component 320 may be substantially the same as the thickness T2 of each of the semiconductor chips 221 and 222. The thickness T3 of the third passive component 330 may be smaller than the thickness T2 of each of the semiconductor chips 221 and 222. The passive components 310, 320, and 330 may be electrically connected to the semiconductor chips 221 and 222 and/or the other passive components 310, 320, and 330 through the connection portion 400. The number and a disposition form of passive components 310, 320, and 330 mounted in the antenna substrate 100A may be variously modified in other exemplary embodiments.

The encapsulant 130 may fill at least portions of the recess portions 110H1, 110H2*a*, 110H2*b*, and 110H3, and encapsulate the semiconductor chips 221 and 222 and the passive components 310, 320, and 330. An encapsulation form of the encapsulant 130 is not particularly limited, and may be a form in which the encapsulant 130 surrounds at least portions of the semiconductor chips 221 and 222 and the passive components 310, 320, and 330. The encapsulant 130 may cover at least portions of lower surfaces of the semiconductor chips 221 and 222 and the passive components 310, 320, and 330, and fill at least portions of spaces between walls of the recess portions 110H1, 110H2*a*, 110H2*b*, and 110H3 and side surfaces of the semiconductor chips 221 and 222 and the passive components 310, 320, and 330.

The connection portion 400 may be disposed beneath the antenna substrate 100A and redistribute connections from and between the semiconductor chips 221 and 222. The connection portion 400 may provide physical and/or electrical connection paths between the antenna substrate 100A, the semiconductor chips 221 and 222, and the passive components 310, 320, and 330, and other components in the set. The connection portion 400 may be a rigid-flexible printed circuit board (RFPCB) or a flexible PCB (FPCB). The connection portion 400 may be attached to the antenna substrate 100A through a connection layer 420, or the like, and the connection layer 420 may be formed of an adhesive member such as a solder adhesive, or the like, or an insulating material. However, according to other exemplary embodiments, the connection portion 400 may be connected to the antenna substrate 100A by solder balls, bumps, or the like. The connection portion 400 may include connection insulating layers 411, connection wiring layers 412, and connection vias 413. The connection portion 400 may include insulating layers, wiring layers, and vias of which the numbers are more than those illustrated in the drawing or are less than those illustrated in the drawing.

A material of each of the connection insulating layers 411 may be an insulating material. In this case, a photosensitive insulating material such as a PID resin may also be used as the insulating material. Each of the connection insulating layers 411 may be a photosensitive insulating layer including an insulating resin and an inorganic filler. The connection wiring layers 412 may serve to substantially redistribute the connection pads 221P and 222P. A material of each of the connection wiring layers 412 may be a conductive material such as copper (Cu), aluminum (Al), silver (Ag), tin (Sn), gold (Au), nickel (Ni), lead (Pb), titanium (Ti), or alloys thereof. The connection vias 413 may electrically connect the connection wiring layers 412, the connection pads 221P and 222P, the passive components 310, 320, and 330, and the like, formed on different layers to each other, resulting in electrical paths between the antenna substrate 100A and other components. A material of each of the connection vias 413 may be a conductive material such as copper (Cu), aluminum (Al), silver (Ag), tin (Sn), gold (Au), nickel (Ni), lead (Pb), titanium (Ti), or alloys thereof. Each of the connection vias 413 may be completely filled with the conductive material or the conductive material may be formed along a wall of a via hole. In addition, each of the connection vias 413 may have any shape known in the related art, such as a tapered shape, a cylindrical shape, and the like.

Figure 10:
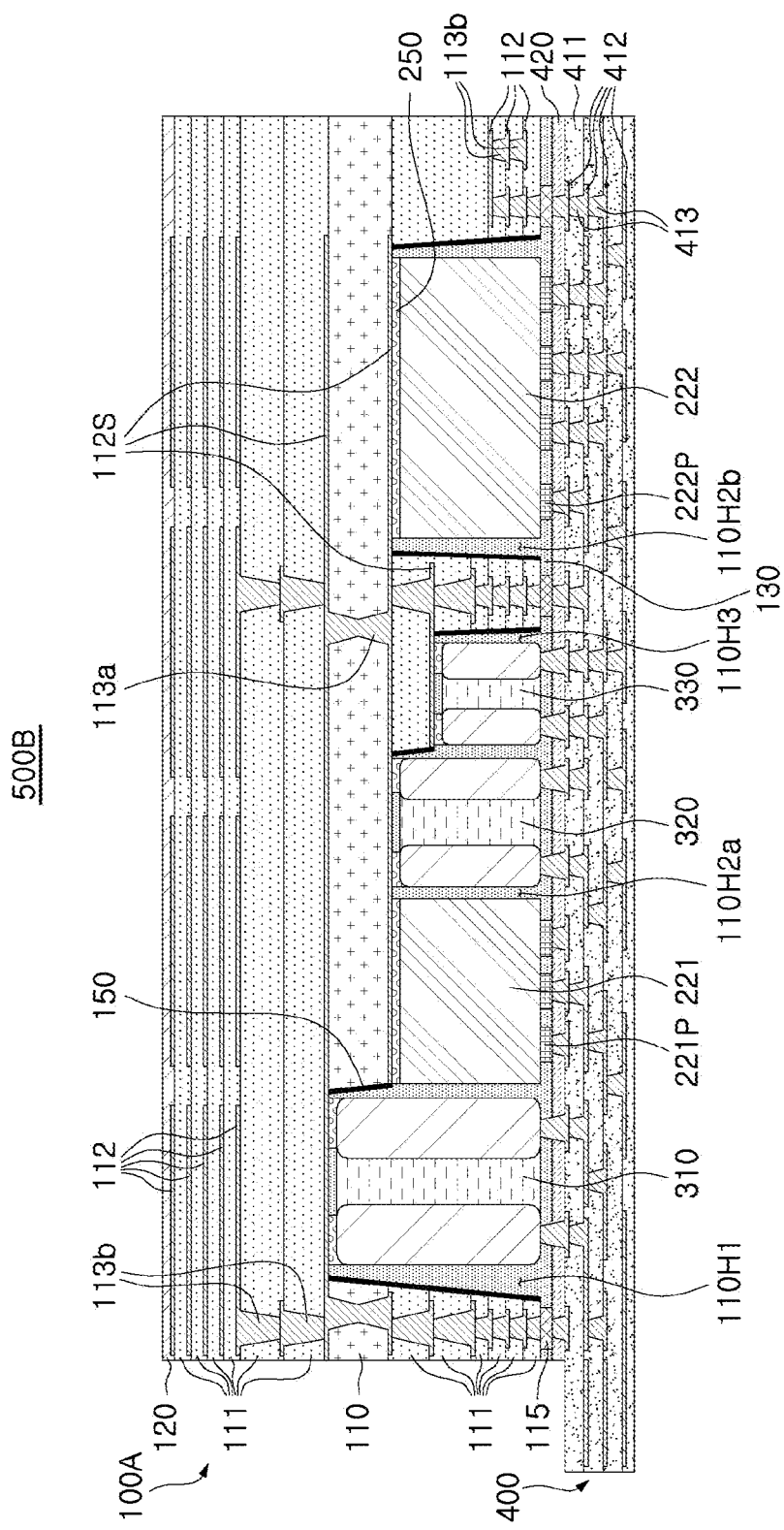
FIG. 10 is a schematic cross-sectional view illustrating an antenna module according to another exemplary embodiment.

FIG. 10 is a schematic cross-sectional view illustrating an antenna module according to another exemplary embodiment in the present disclosure.

Referring to FIG. 10, an antenna module 500B according to another exemplary embodiment may further include a metal layer 150 disposed on inner sidewalls of recess portions 110H1, 110H2a, 110H2b, and 110H3. The metal layer 150 may be disposed on sidewalls of an antenna substrate 100A exposed through the recess portions 110H1, 110H2a, 110H2b, and 110H3. The metal layer 150 may be introduced in order to improve an EMI shielding effect and a heat dissipation effect of semiconductor chips 221 and 222 and passive components 310, 320, and 330. The metal layer 150 may include a metal such as copper (Cu), aluminum (Al), silver (Ag), tin (Sn), gold (Au), nickel (Ni), lead (Pb), titanium (Ti), or alloys thereof. When the metal layer 150 is formed of a conductive material, the metal layer 150 may be in an electrically floated state or be used as a ground. In this case, the metal layer 150 may be electrically connected to grounds of wiring layers 112. Other configurations overlap those described above in the antenna module 500A according to the exemplary embodiment, and a detailed description thereof is thus omitted.

Figure 11:
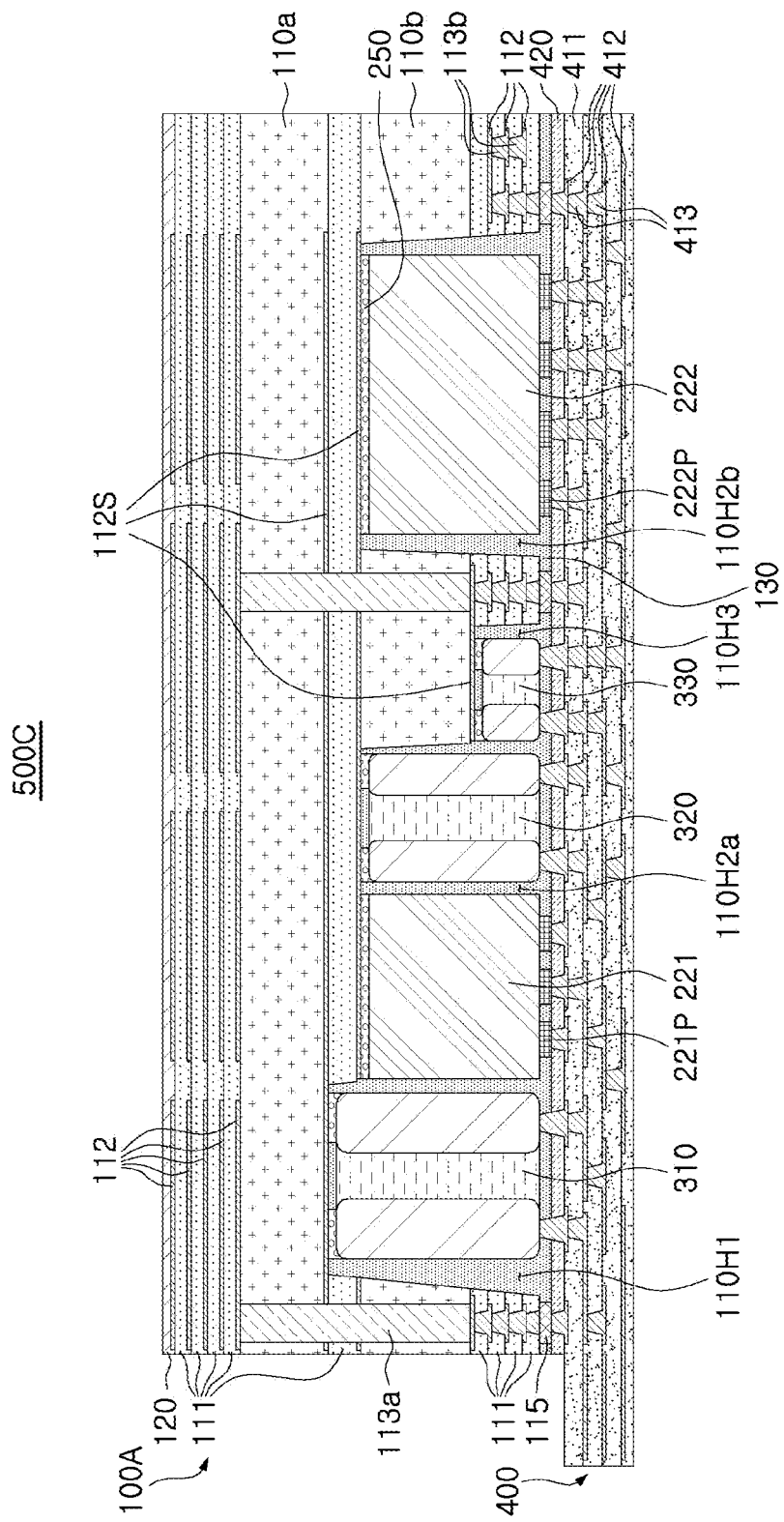
FIG. 11 is a schematic cross-sectional view illustrating an antenna module according to another exemplary embodiment.

FIG. 11 is a schematic cross-sectional view illustrating an antenna module according to another exemplary embodiment in the present disclosure.

Referring to FIG. 11, in an antenna module 500C according to another exemplary embodiment, an antenna substrate 100A may include first and second core layers 110a and 110b. The first and second core layers 110a and 110b may be disposed to be spaced apart from each other in a vertical direction, and an insulating layer 111 may be interposed between the first and second core layers 110a and 110b. A first connection via layer 113a may be disposed to penetrate through both of the first and second core layers 110a and 110b, but is not limited thereto. For example, a first recess portion 110H1 may extend up to a lower surface of the first core layer 110a, second recess portions 110H2a and 110H2b may extend up to an upper surface of the second core layer 110b, and a third recess portion 110H3 may extend up to a lower surface of the second core layer 110b. Other configurations overlap those described above in the antenna module 500A according to the exemplary embodiment, and a detailed description thereof is thus omitted.

Figure 12:
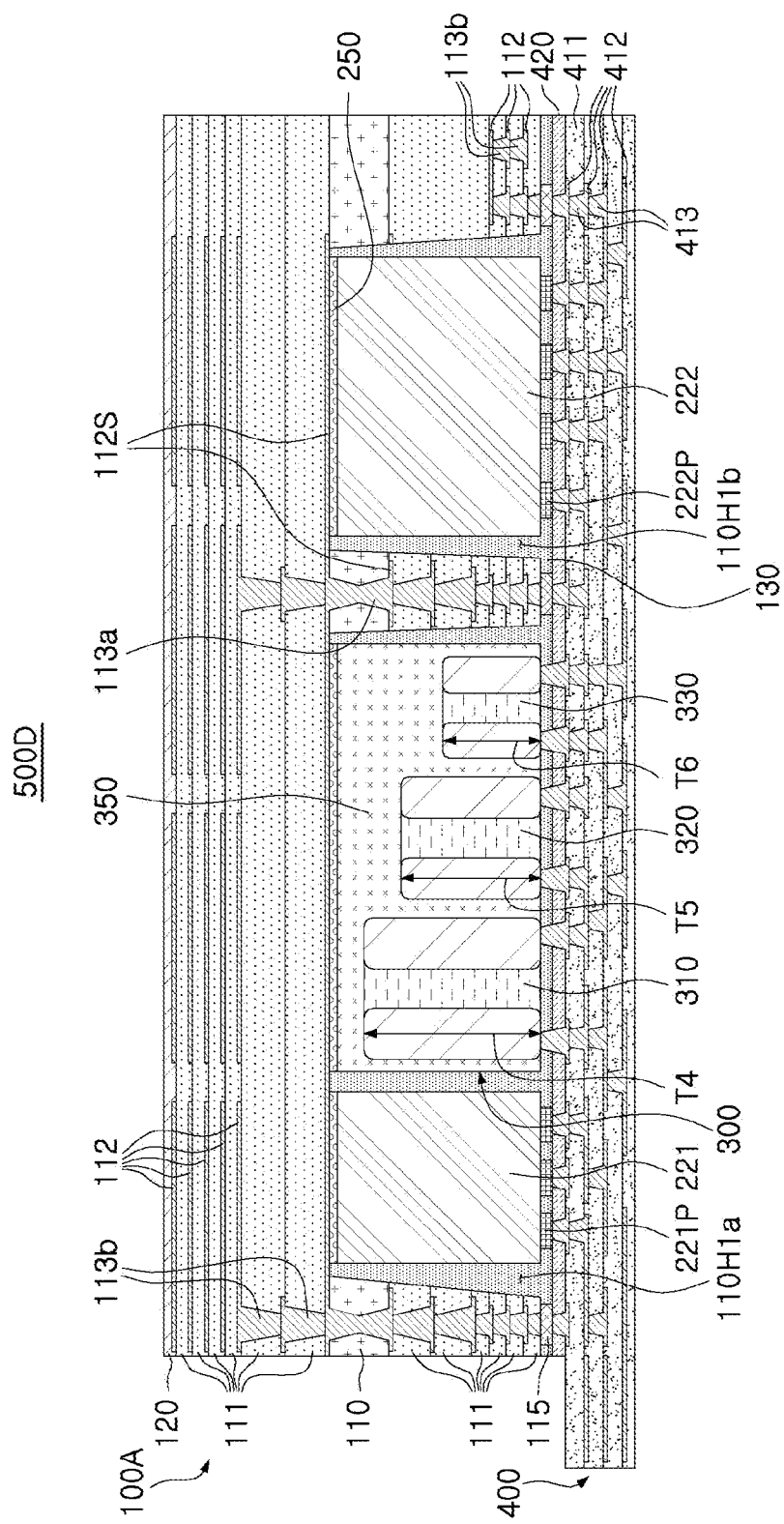
FIG. 12 is a schematic cross-sectional view illustrating an antenna module according to another exemplary embodiment.

FIG. 12 is a schematic cross-sectional view illustrating an antenna module according to another exemplary embodiment in the present disclosure.

Referring to FIG. 12, an antenna module 500D according to another exemplary embodiment may include a component module 300 including passive components 310, 320, and 330. The component module 300 may include the passive components 310, 320, and 330 and an encapsulation layer 350 surrounding at least portions of the passive components 310, 320, and 330. The encapsulation layer 350 may include an insulating material. For example, a thermosetting resin such as an epoxy resin, a thermoplastic resin such as a polyimide resin, a resin having a reinforcing material such as an inorganic filler impregnated in the thermosetting resin and the thermoplastic resin, such as an ABF, FR-4, Bismaleimide Triazine (BT), a PID resin, or the like, may be used as the insulating material. In addition, any known molding material such as an epoxy molding compound (EMC), or the like, may be used. At least portions including electrode portions of the passive components 310, 320, and 330 may be exposed through a lower surface of the encapsulation layer 350. Therefore, the passive components 310, 320, and 330 may be connected to a connection portion 400 disposed therebeneath. According to other exemplary embodiments, a metal layer may further be formed on a surface of the encapsulation layer 350 to shield EMI. The component module 300 may be formed by modularizing the passive components 310, 320, and 330 having different thicknesses T4, T5, and T6 in one block form, such that the number of recess portions 110H1a and 110H1b that are to be formed may be significantly reduced, resulting in simplification of processes.

The component module 300 may be mounted side by side with a first semiconductor chip 221 in one recess portion 110H1a. In addition, the number of component modules 300 mounted in the recess portions 110H1a and 110H1b may be variously modified in other exemplary embodiments, and a plurality of component modules may be mounted in one recess portion 110H1a or 110H1b. A case in which two recess portions 110H1a and 110H1b have the same depth is illustrated in FIG. 12, but the recess portions 110H1a and 110H1b are not limited thereto. Other configurations overlap those described above in the antenna module 500A according to the exemplary embodiment, and a detailed description thereof is thus omitted.

Figure 13:
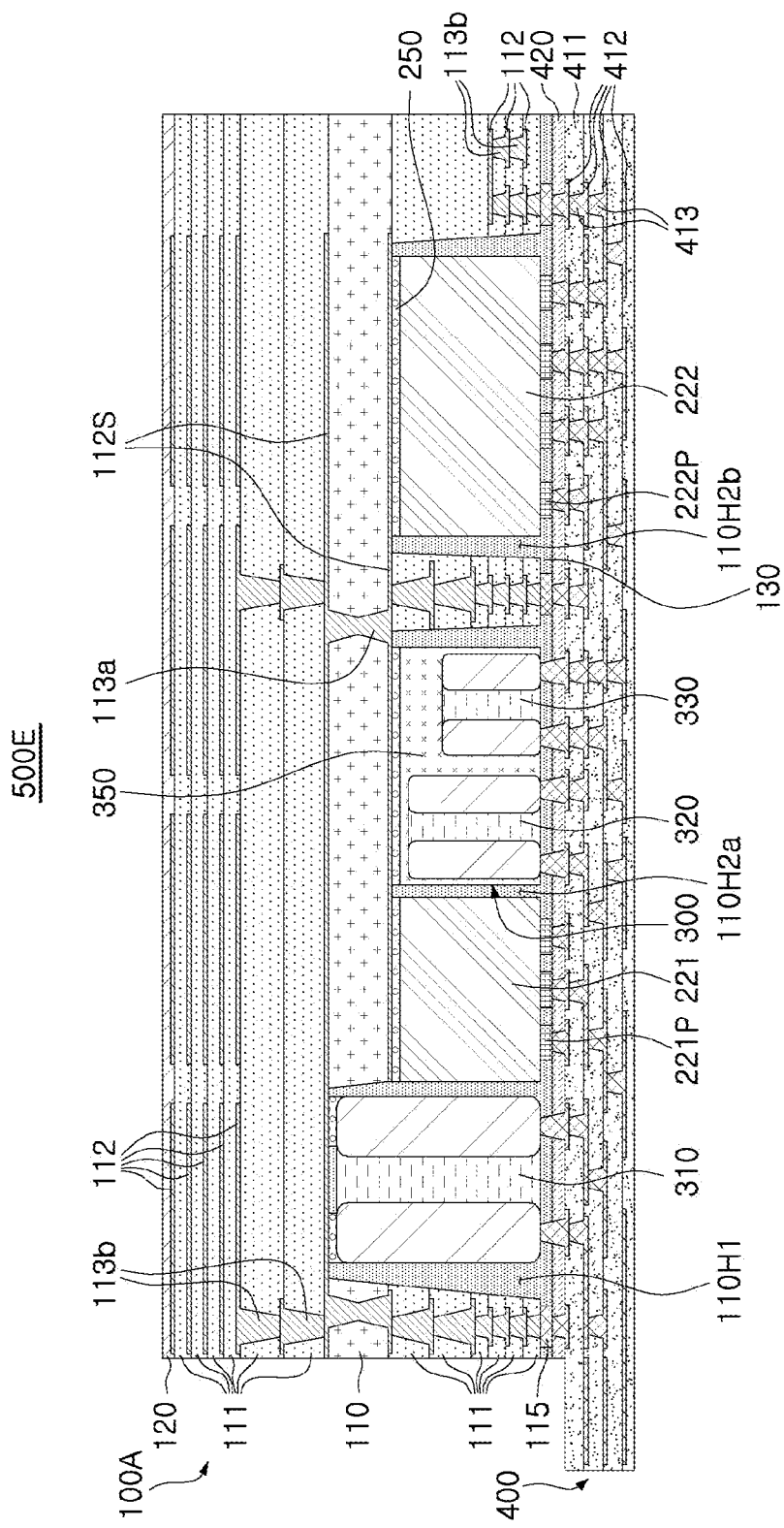
FIG. 13 is a schematic cross-sectional view illustrating an antenna module according to another exemplary embodiment.

FIG. 13 is a schematic cross-sectional view illustrating an antenna module according to another exemplary embodiment in the present disclosure.

Referring to FIG. 13, an antenna module 500E according to another exemplary embodiment may include a component module 300 including passive components 320 and 330. The component module 300 may include an encapsulation layer 350 surrounding at least portions of the passive components 320 and 330. Contents described in the antenna module 500D according to another exemplary embodiment described above may be applied to the encapsulation layer 350. The component module 300 may be formed by modularizing some passive components 320 and 330 of the passive components 310, 320, and 330 in one block form, such that the number of recess portions 110H1, 110H2a, and 110H2b that are to be formed may be significantly reduced, resulting in simplification of processes. For example, the passive component 310 having a thickness greater than that of each of semiconductor chips 221 and 222 may be mounted in a first recess portion 110H1, and the passive components 320 and 330 having a thickness smaller than that of each of semiconductor chips 221 and 222 may be manufactured in a block form to form the component module 300, and may be mounted together with the semiconductor chips 221 and 222 in second recess portions 110H2a and 110H2b. The component module 300 may be mounted side by side with a first semiconductor chip 221 in one recess portion 110H2a. Other configurations overlap those described above in the antenna module 500A according to the exemplary embodiment, and a detailed description thereof is thus omitted.

As set forth above, according to an exemplary embodiment in the present disclosure, an antenna module of which a degree of freedom may be secured when the antenna module is mounted in a set by a reduction in an entire thickness thereof may be provided.

While exemplary embodiments have been shown and described above, it will be apparent to those skilled in the art that modifications and variations could be made without departing from the scope of the present invention as defined by the appended claims.

What is claimed is:

1. An antenna module comprising:
an antenna substrate including a core layer, a plurality of insulating layers disposed on opposite surfaces of the core layer, and a plurality of wiring layers including antenna patterns, and having first and second recess portions recessed from a lower surface thereof;
a passive component disposed in the first recess portion;
a semiconductor chip disposed in the second recess portion and having an active surface having connection pads disposed thereon and an inactive surface opposing the active surface;
an encapsulant encapsulating at least portions of the semiconductor chip and the passive component; and
a connection portion disposed on the active surface of the semiconductor chip and including redistribution layers electrically connected to the connection pads of the semiconductor chip,
wherein the passive component has a thickness greater than that of the semiconductor chip, and the first recess portion has a depth greater than that of the second recess portion.

2. The antenna module of claim 1, wherein the wiring layers further include stopper layers disposed on bottom surfaces of the first and second recess portions.

3. The antenna module of claim 1, wherein the first recess portion penetrates through the core layer.

4. The antenna module of claim 3, wherein the second recess portion extends up to a lower surface of the core layer.

5. The antenna module of claim 1, wherein the second recess portion extends up to some of the insulating layers below the core layer.

6. The antenna module of claim 1, wherein the antenna substrate further has a third recess portion having a depth different from those of the first and second recess portions, and
the antenna module further comprises an electronic component disposed in the third recess portion.

7. The antenna module of claim 1, wherein the antenna substrate further includes a metal layer disposed on inner sidewalls of the first and second recess portions.

8. The antenna module of claim 1, wherein the core layer includes first and second core layers disposed to be spaced apart from each other in a vertical direction orthogonal to the lower surface of the antenna substrate.

9. The antenna module of claim 8, wherein at least one of the first and second recess portions extends up to a lower surface of at least one of the first and second core layers.

10. The antenna module of claim 1, further comprising an electronic component disposed in the second recess portion, the electronic component being spaced apart from the semiconductor chip and being disposed side by side with the semiconductor chip.

11. The antenna module of claim 1, wherein a lower surface of the semiconductor chip is coplanar with a lower surface of the passive component.

12. The antenna module of claim 1, wherein the antenna substrate further has a third recess portion having a depth different from those of the first and second recess portions, and
the antenna module further comprises a component module disposed in the third recess portion and including electronic components having different thicknesses.

13. The antenna module of claim 12, wherein the component module further includes an encapsulation layer surrounding at least portions of the electronic components.

14. An antenna module comprising:
an antenna substrate including antenna patterns and having first and second recess portions recessed from a lower surface thereof;
a semiconductor chip disposed in the first recess portion of the antenna substrate and having an active surface having connection pads disposed thereon and an inactive surface opposing the active surface;
at least one passive component disposed in the second recess portion of the antenna substrate;
an encapsulant encapsulating at least portions of the semiconductor chip and the passive component; and
stopper layers disposed over entire bottom surfaces of the first and second recess portions.

15. The antenna module of claim 14, further comprising an encapsulation layer surrounding at least portions of the at least one passive component, and
the at least one passive component is encapsulated by the encapsulation layer, and is disposed in a single component module form in the second recess portion.

16. The antenna module of claim 14, wherein the at least one passive component has a thickness greater than that of the semiconductor chip, and a lower surface of the at least one passive component is coplanar with a lower surface of the semiconductor chip.

17. An antenna module comprising:
an antenna substrate including antenna patterns and having first and second recess portions having different first and second depths recessed from a lower surface of the antenna substrate;
first and second passive components having different respective heights and respectively disposed in the first and second recess portions of the antenna substrate;
an encapsulant encapsulating at least portions of the first and second passive component; and
a connection portion disposed on the lower surface of the antenna substrate and including redistribution layers electrically connected to electrical terminals of the first and second passive components,
wherein surfaces of the first and second passive components facing the connection portion are substantially aligned with a lower surface of the antenna substrate facing the connection portion.

18. The antenna module of claim 17, wherein the first passive component has a first thickness greater than a second thickness of the second passive component, and the second depth of the second recess portion is greater than the second thickness and smaller than the first thickness.

19. The antenna module of claim 17, further comprising:
a semiconductor chip disposed in the second recess portion and having an active surface having connection pads and facing the connection portion.

20. The antenna module of claim 17, wherein the antenna substrate further comprises a core layer, a plurality of insulating layers disposed on opposite surfaces of the core layer, and a plurality of wiring layers including antenna patterns.

* * * * *